(12) United States Patent
Sweeney et al.

(10) Patent No.: US 8,633,597 B2
(45) Date of Patent: Jan. 21, 2014

(54) THERMAL VIAS IN AN INTEGRATED CIRCUIT PACKAGE WITH AN EMBEDDED DIE

(75) Inventors: Fifin Sweeney, San Diego, CA (US); Milind P. Shah, San Diego, CA (US); Mario Francisco Velez, San Diego, CA (US); Damion B. Gastelum, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 420 days.

(21) Appl. No.: 12/714,918

(22) Filed: Mar. 1, 2010

(65) Prior Publication Data

US 2011/0210438 A1    Sep. 1, 2011

(51) Int. Cl.
*H01L 23/48* (2006.01)
*H01L 23/52* (2006.01)
*H01L 29/40* (2006.01)

(52) U.S. Cl.
USPC ........... 257/778; 257/685; 257/720; 257/678; 257/E21.006; 257/E21.077; 257/E21.499; 257/E21.503; 257/E21.511; 257/E23.051; 257/E23.101; 438/108; 438/109; 438/612; 438/613

(58) Field of Classification Search
USPC .......... 257/685, 686, 695, 777, 778, E23.051, 257/E23.101, 678, 720, 717, 762; 438/108, 438/109, 612, 613
See application file for complete search history.

(56) References Cited

U.S. PATENT DOCUMENTS

| | | | | |
|---|---|---|---|---|
| 5,842,275 A | * | 12/1998 | McMillan et al. | 29/840 |
| 6,134,110 A | * | 10/2000 | Langari | 361/700 |
| 6,265,771 B1 | | 7/2001 | Ference et al. | |
| 2002/0074668 A1 | * | 6/2002 | Hofstee et al. | 257/777 |
| 2004/0119149 A1 | | 6/2004 | Yin Pang et al. | |
| 2004/0125578 A1 | | 7/2004 | Konishi et al. | |
| 2005/0280141 A1 | * | 12/2005 | Zhang | 257/707 |
| 2006/0270106 A1 | * | 11/2006 | Chiu et al. | 438/106 |
| 2006/0289988 A1 | * | 12/2006 | Ryan | 257/720 |
| 2007/0018312 A1 | | 1/2007 | Jo | |
| 2007/0176298 A1 | | 8/2007 | Osone et al. | |
| 2007/0205502 A1 | * | 9/2007 | Liu et al. | 257/712 |
| 2007/0267740 A1 | * | 11/2007 | Khan et al. | 257/712 |
| 2007/0290322 A1 | * | 12/2007 | Zhao et al. | 257/690 |
| 2009/0034204 A1 | * | 2/2009 | Wayman et al. | 361/709 |
| 2009/0250809 A1 | | 10/2009 | Yoshida | |
| 2010/0301470 A1 | * | 12/2010 | Gurrum et al. | 257/713 |

FOREIGN PATENT DOCUMENTS

EP    1256980 A2    11/2002

OTHER PUBLICATIONS

International Search Report and Written Opinion—PCT/US2011/026539, ISA/EPO—Sep. 7, 2011.

* cited by examiner

*Primary Examiner* — David Nhu
(74) *Attorney, Agent, or Firm* — Michelle S. Gallardo

(57) ABSTRACT

In a multi-module integrated circuit package having a package substrate and package contacts, a die is embedded in the package substrate with thermal vias that couple hotspots on the embedded die to some of the package contacts.

29 Claims, 5 Drawing Sheets

THERMAL VIAS IN AN INTEGRATED CIRCUIT PACKAGE WITH AN EMBEDDED DIE

FIELD

The present invention relates to integrated circuit packages, and more particularly to removing heat from an integrated circuit package.

BACKGROUND

In electronic system-in-package (or package-in-package) technology, a single package comprises one or more dice, where one or more of these dice are in their own individual packages. An example is provided in FIG. 1. FIG. 1 is a simplified, plan view (not to scale) illustration of a flip chip stacked module package. A die 102 is flip chipped, with its active side facing a package substrate 104. In the flip chip process, also formally called the Controlled Collapse Chip Connection (C4) evaporative bump process, conductive bumps (106) are formed and soldered to pads on the active side of the die 102. The solder bumped die 102 is then placed face down onto matching bonding pads on the package substrate 104, which may be a multilayer organic substrate. The assembly is reflowed so that the conductive bumps 106 are soldered to pads on the package substrate 104 so as to provide electrical connection between the active side of the die 102 and the package substrate 104. The conductive bumps 106 also provide a load bearing link between the die 102 and the package substrate 104. Usually, the conductive bumps comprise solder. The package substrate 104 includes electrical interconnects so that the conductive bumps 106 are electrically connected to at least some of a plurality of package contacts 108.

Attached to the backside of the die 102 is a package 110. This is a wirebond package, where a die 112 is attached to a package substrate 114, and electrical connection is provided by way of wirebonds from the active side of the die 112 to pads on the package substrate 114. As an example, one such wirebond, labeled 116, is shown. Wirebonds from pads on the outer side of the substrate package 114 provide electrical connection to the package substrate 104. For example, one such wirebond, labeled 118, is shown. Attached to the package 110 is a die 120, which is wirebonded to the package substrate 104. For example, one such wirebond, labeled 122, is shown.

An epoxy resin, sometimes referred to as an underfill, is usually applied to help compensate for the difference in the coefficient of thermal expansion (CTE) between the die 102 and the package substrate 104, and to prevent moisture damage. The assembly may also be capped with a liquid epoxy for further protection, resulting in the final system-in-package 124.

For some applications, the die 102 may comprise digital logic circuits, the package 110 may be a memory module, and the die 120 may comprise analog circuits.

As more and more integration takes place in system-in-package technology, thermal management may present a challenge. Conventional thermal management includes thermal vias in the package substrate 104, and the use of heat spreaders. However, for heat to escape from the die 120 to the package contacts 108, the heat flows from the die 120 through various materials in the package 110, the flip-chipped die 102, the underfill, and the package substrate 104, and through the package contacts 108 before escaping the system-in-package 124. It would be desirable to provide a system-in-package technology with efficient thermal pathways for heat to escape.

SUMMARY

In an embodiment, a die is embedded in a package substrate. The package substrate has package contacts. Thermal vias in the package substrate couple the die to at least some of the package contacts. At least one of the thermal vias has a cross-sectional shape substantially similar to a union of at least two overlapping circles.

In another embodiment, a hole is formed in a package substrate core, where the package substrate core has a first side with a first metal layer, and a second side with a second metal layer. Tape is placed on the second side of the package substrate core. A die is then placed into the hole, the die having a first side, and a second side proximal to the tape. A substrate is formed on the first side of the die, the first metal layer, and the first side of the package substrate core. Thermal vias are formed in the substrate to couple to the first side of the die at thermal hotspots of the die.

In another embodiment, a hole is formed in a package substrate core, where the package substrate core has a first side with a first metal layer, and a second side with a second metal layer. Tape is placed on the second side of the package substrate core. A die is placed into the hole, where the die has a first side and a second side proximal to the tape. A first substrate is formed on the first side of the die, the first metal layer, and the first side of the package substrate core. The tape is removed. A second substrate is formed on the second side of the die, the second metal layer, and the second side of the package substrate core. Thermal vias are formed in the second substrate to couple to the second side of the die at thermal hotspots of the die.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
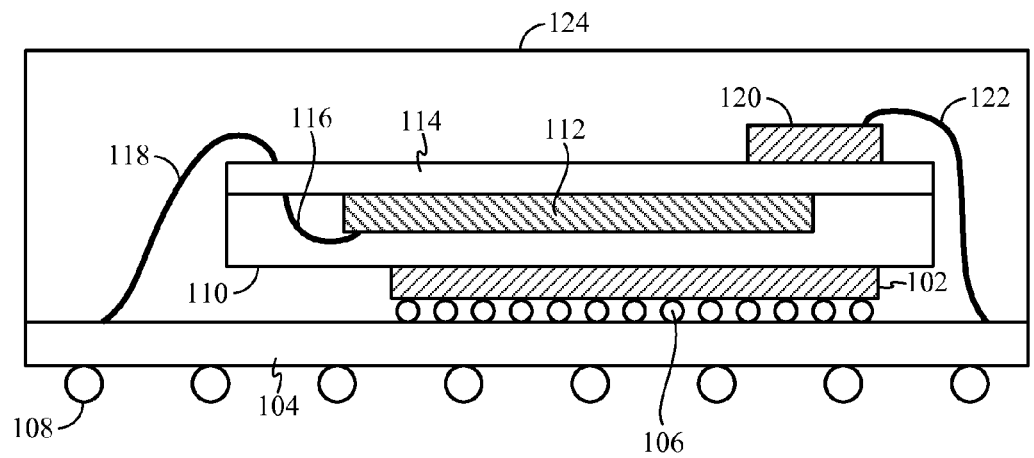
FIG. 1 is a plan view of a conventional multi-module integrated circuit package.
Figure 2A:
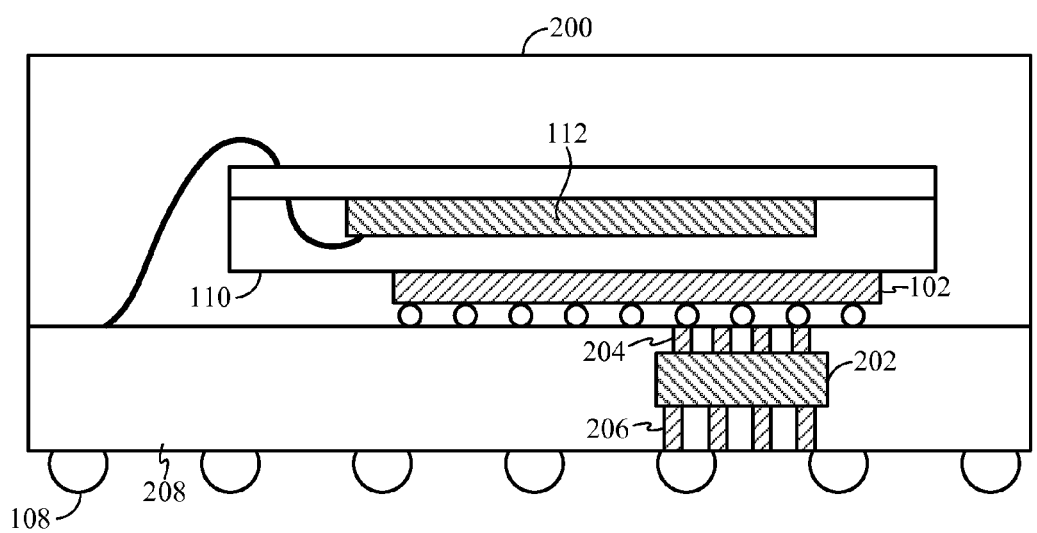
FIGS. 2A and 2B illustrate an integrated circuit package with an embedded die and thermal vias.

FIG. 2A illustrates a simplified plan view (not drawn to scale) of a system-in-package 200, where a die 202 is embedded within a package substrate 208. As in FIG. 1, the system-in-package 200 comprises the flip chipped die 102, and the die 112 in its own package 110. In the particular embodiment of FIG. 2A, the active side of the die 202 faces away from the side of the package substrate 208 that is connected to the package contacts 108. Copper plating (or contacts) on the active side of the die 202 are shown in FIG. 2A, where one such example of copper plating is labeled as 204. Although not explicitly shown, the copper plating 204 is electrically connected to traces in the package substrate 208 so as to be electrically connected to at least some of the package contacts 108.

In the illustration of FIG. 2A, thermal vias in the package substrate 208 are coupled to the backside of the die 202, and are coupled to at least some of the package contacts 108 so that an efficient thermal path may be provided between the die 202 and some of the package contacts 108. One such thermal via is labeled as 206. The thermal vias may comprise copper, for example, so that they may also be electrically conductive.

Figure 2B:
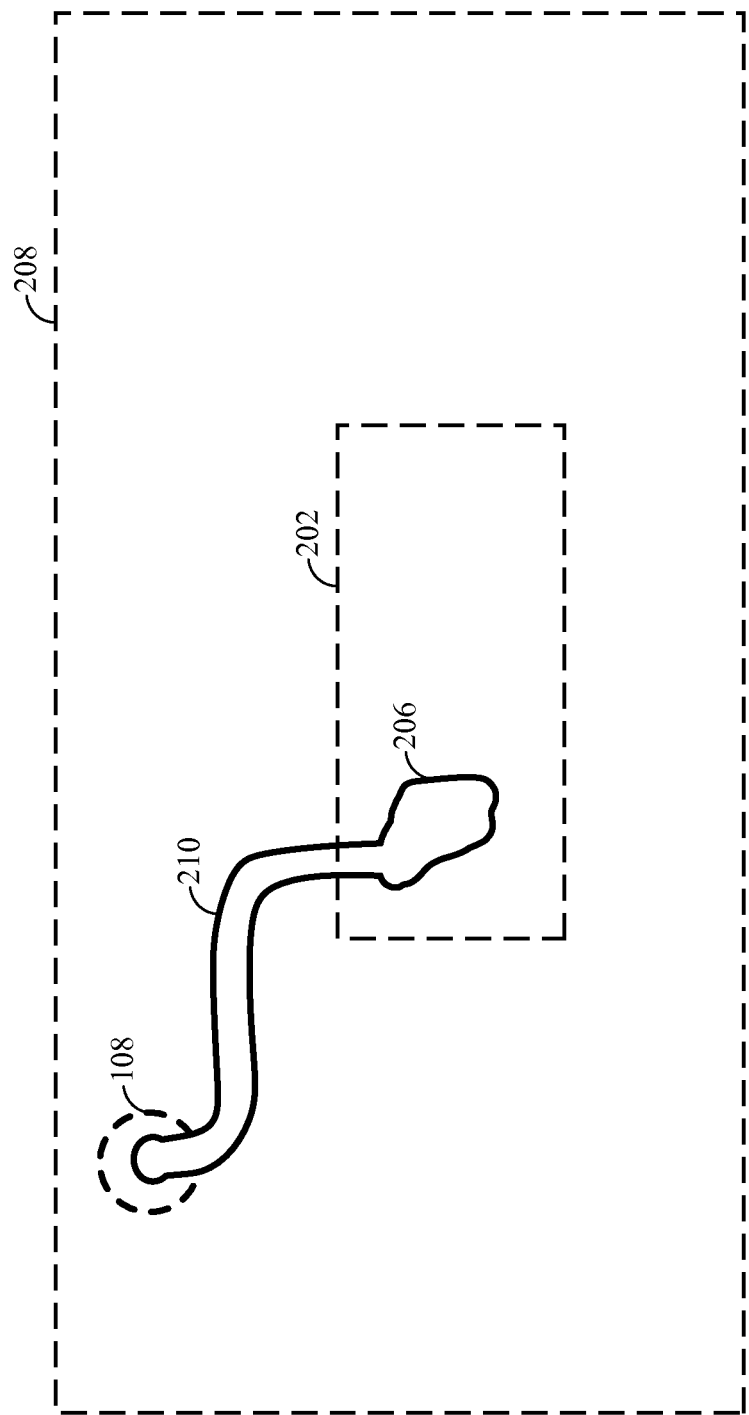

For a thermal via not positioned directly over a package contact, a trace may be formed within the package substrate to continue the thermal path to one of the package contacts. This is illustrated in FIG. 2B, where a trace 210 provides a conductive thermal path from the thermal via 206 to the package contact 108, where it is assumed that there is no package contact positioned directly underneath the thermal via 206. The orientation of the view illustrated in FIG. 2B is orthogonal to the view illustrated in FIG. 2A, where FIG. 2B illustrates a slice of an embodiment along the die 202 parallel to the face of the package substrate 208. For ease of illustration, FIG. 2B is not drawn to scale, and is not scaled to the illustration in FIG. 2A. In FIG. 2B, the dashed line 202 represents the outline of the die 202 in FIG. 2A, and the dashed line 208 represents the outline of the package substrate 208 in FIG. 2A. These outlines are dashed to indicate that they lie above and below the slice through the die 202 that provides the view of FIG. 2B.

For some embodiments, the die 202 may be embedded in the package substrate 208 so that its active side faces the side of the package substrate 208 that is attached to the package contacts 108. For such embodiments, some of the thermal vias may, in addition to providing a thermal path, also provide electrical connection to some of the active components on the active side of the die 202 to one or more of the package contacts 108.

Figure 3:
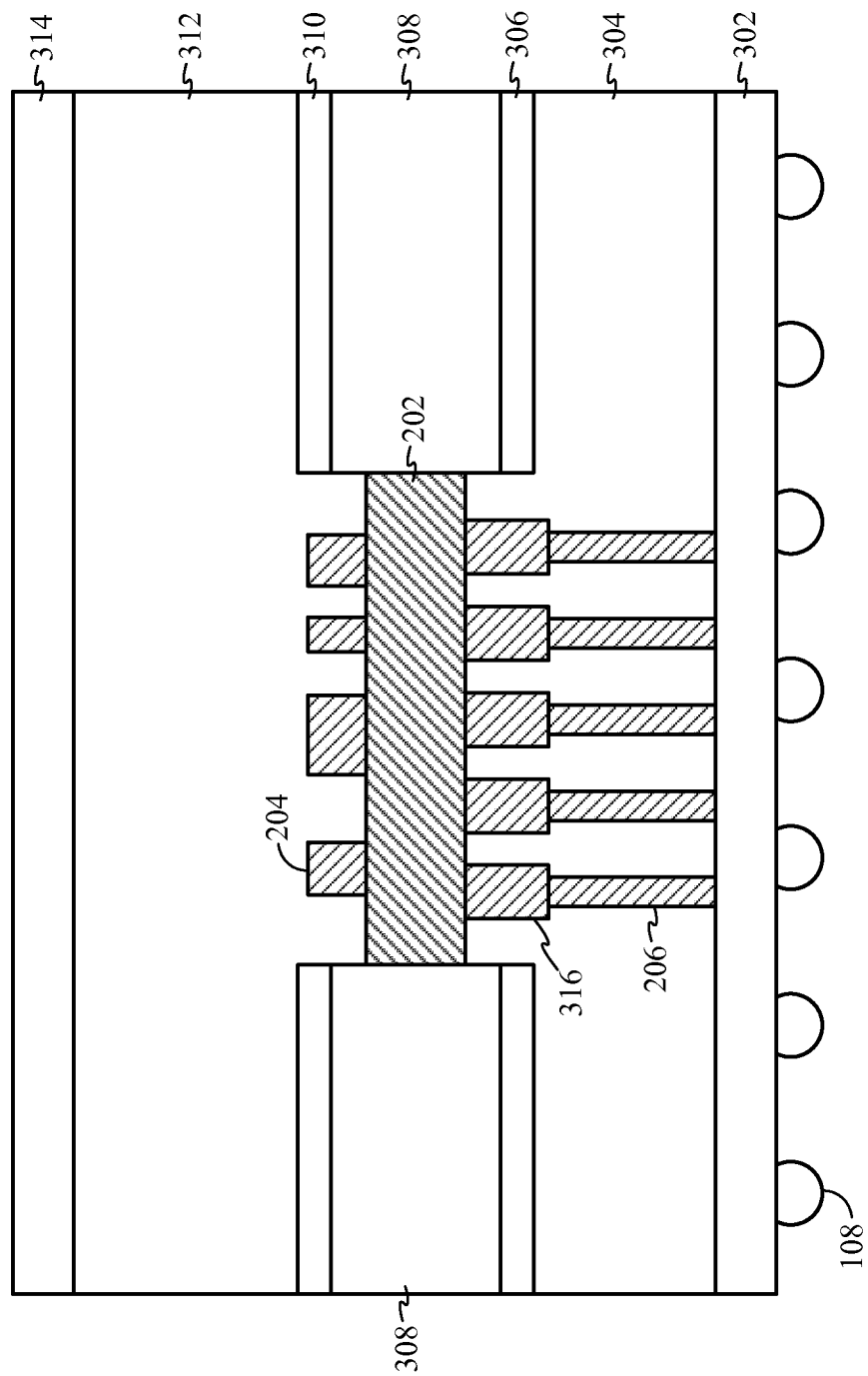
FIG. 3 is a plan view of a portion of an integrated circuit package with an embedded die and thermal vias.

FIG. 3 is a plan view (not to scale) of a portion of the package substrate 208 with the embedded die 202, but in greater detail than the illustration of FIG. 2A. The package substrate of FIG. 3 is shown to be multilayered comprising a metal layer 302, a substrate 304, a metal layer 306, a core 308, a metal layer 310, a substrate 312, and a metal layer 314. The metal layers may comprise copper. Various materials and laminates may be used for the substrates and the core. The core 308 may comprise the same material as used for the substrates. For some embodiments FR-4 (Flame Retardant 4) may be used for the core 308 or the substrates, or polyimide may be used, for example.

The plan view illustrated in FIG. 3 is simplified because it does not show openings in the metal layers, except for the openings to the die 202. That is, the illustration is simplified in the sense that the plan view of the metal layers, which is a slice of an embodiment in a direction perpendicular to the direction of view in the illustration, shows the metal layers as rectangles. In practice, etching is performed on the metal layers so that electrical connections may be made to various components.

Copper plating on the backside of the die 202 thermally couples various hotspots to the thermal vias 206. One such example of the copper plating is labeled as 316 in FIG. 3. For some embodiments, a thermal analysis may be performed on the die 202 so that the copper plating 316 is deposited on the hotspots, or at least some of the hotspots. This allows fine tuning of the thermal management.

For some embodiments, the active side of the die 202 may face the metal layer 306, in which case some of the copper plating 316 may provide electrical connection to various devices on the active side as well as thermal coupling. For such embodiments in which the active side faces the metal layer 306, the copper plating as represented by the label 204 may not necessarily be needed.

Figure 4:
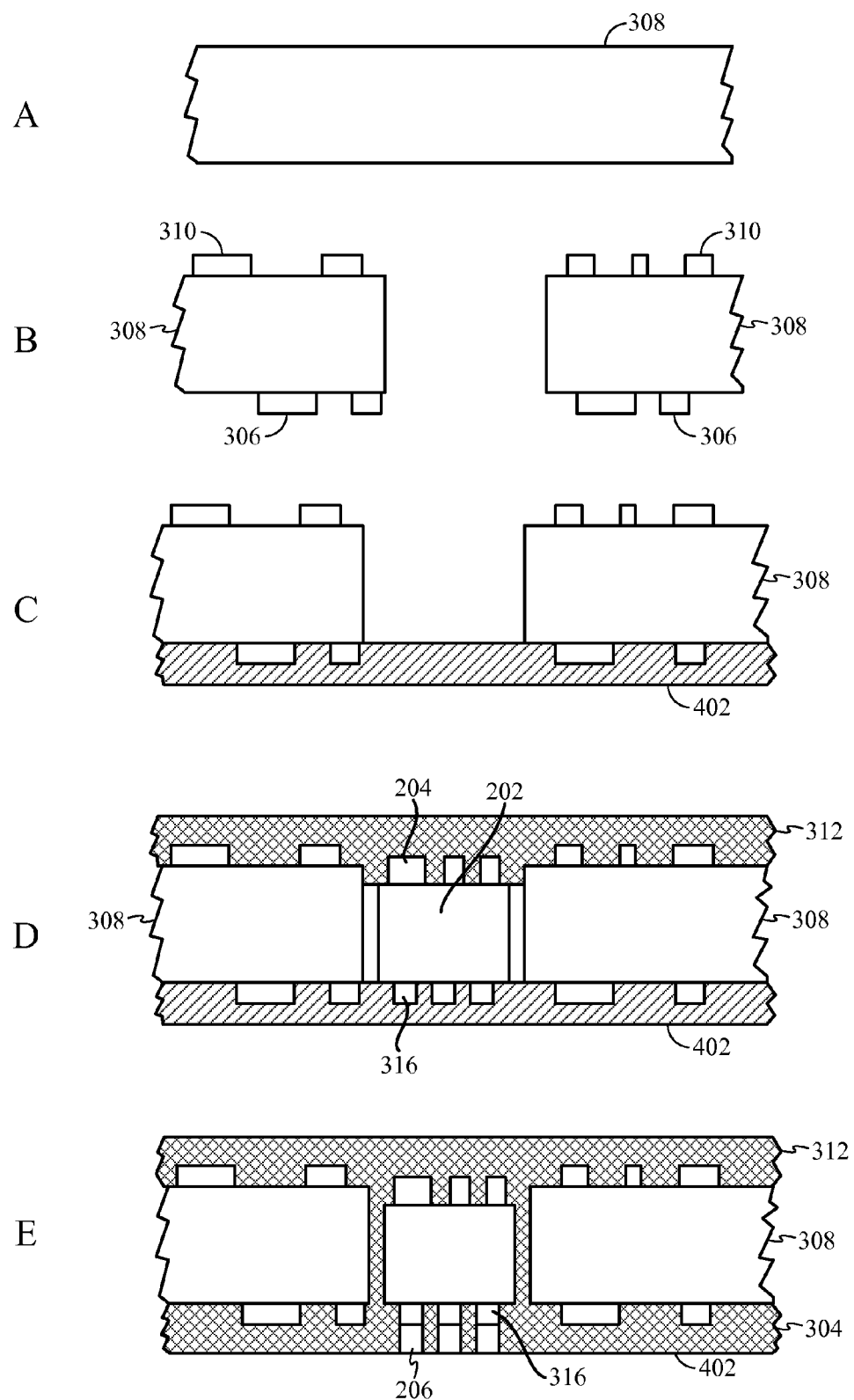
FIG. 4 is a plan view illustrating a procedure for embedding a die in an integrated circuit package substrate with thermal vias.

FIG. 4 shows various plan views (not to scale) illustrating a procedure for embedding the die 202 into the core 308, where the procedure sequence is indicated by the letters A through E. Starting with the core 308 in A, a hole is drilled into the core 308 in B. In B, the metal layers 306 and 310 have been deposited on both sides of the core 308, and etching has been performed on these metal layers to provide the traces. In C, a tape 402 is attached to the bottom of the core 308, and in D the die 202 is dropped into the hole that was drilled in the core 308. The die 202 includes the copper plating 204 and 316. The substrate 312, such as FR-4, is laminated on top of the assembly. This substrate material is indicated by crosshatches. In E, the tape 402 has been removed and the substrate 304 is laminated on the bottom, again crosshatched. Thermal vias 206 are formed into the substrate 304 to make contact with the copper plating 316.

For ease of illustration, the previous drawings illustrated the thermal vias 206 as being uniformly positioned along the bottom face of the die 202, but in practice, because the thermal vias 206 are coupled to hotspots on the die 202, the positioning of the thermal vias 206 may not be uniform. Also, because the thermal vias 206 are concentrated about various hotspots, the shape for some of the thermal vias 206 is not expected to be substantially cylindrical as for the case of power or signal vias. Some of the thermal vias 206 may be the union of two or more cylinders that overlap each other.

Figure 5:
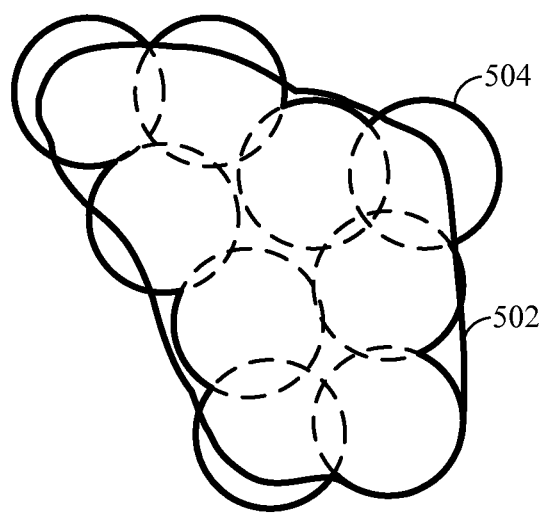
FIG. 5 illustrates a cross-sectional plan view of a thermal via covering a thermal hotspot.

FIG. 5 illustrates a cross-sectional plan view (not necessarily drawn to scale) of a thermal via comprising a plurality of individual vias. The cross-sectional view is a slice taken parallel to the bottom face of the die 202 and substantially perpendicular to the thermal vias 206. The cross-sectional plan view of the measured hotspot which the thermal via is to cover is illustrated by the irregular shape having the outline labeled 502. The shape of the thermal via is formed from the union of a number of overlapping cylindrical shapes, which appear as circles in the illustration. The outer envelope of the union of these circles is illustrated as a solid line with the label 504. The parts of the circles that are not part of the envelope are illustrated with dashed lines.

In the illustration of FIG. 5, the thermal via does not completely cover the thermal hotspot 502, but for some embodiments a shape for a thermal via may be synthesized by forming the union of more circles so as to completely cover the thermal hotspot. In practice, perfect circles may not be realized, so that the cross-sectional shape of the thermal via may only be substantially similar to a geometric shape formed by the union of overlapping circles.

Various modifications may be made to the described embodiments without departing from the scope of the invention as claimed below. For example, in E of FIG. 4, thermal vias could be formed in the substrate 312 instead of the substrate 304. That is, the substrate 312 that is applied before the tape 402 is removed may contain the thermal vias.

What is claimed is:

1. An article of manufacture comprising:
   a substrate connected to a plurality of package contacts;
   a die embedded in the substrate; and
   a plurality of thermal vias formed in the substrate that are coupled to the die at thermal hotspots on the die and couple the thermal hotspots on the die to at least one of the plurality of package contacts, wherein a thermal via belonging to the plurality of thermal vias has a cross-sectional shape substantially similar to a union of at least two overlapping circles to substantially cover a thermal hotspot belonging to the thermal hotspots on the die.

2. The article of manufacture as set forth in claim 1, the die having an active side and a backside, wherein the plurality of thermal vias are coupled to the backside of the die and provide a thermal path between the hotspots on the die and the at least one of the plurality of package contacts.

3. The article of manufacture as set forth in claim 2, further comprising copper plating deposited on the backside of the die at the hotspots on the die, wherein the copper plating thermally couples the hotspots on the die to the plurality of thermal vias.

4. The article of manufacture as set forth in claim 1, the substrate having a first face and a second face, wherein the first face is in contact with the plurality of package contacts, the article of manufacture further comprising a flip chipped die coupled to the second face.

5. The article of manufacture as set forth in claim 1, the substrate comprising a first substrate portion, a core, and a second substrate portion, wherein the die is embedded in the core.

6. The article of manufacture as set forth in claim 5, wherein the plurality of thermal vias are embedded only in the first substrate portion.

7. The article of manufacture as set forth in claim 5, the substrate further comprising a metal layer in contact with the plurality of package contacts and the first substrate portion.

8. The article of manufacture as set forth in claim 7, wherein the plurality of thermal vias are in contact with at least a portion of the metal layer.

9. The article of manufacture as set forth in claim 1, wherein the plurality of thermal vias are electrically conductive.

10. The article of manufacture as set forth in claim 1, further comprising a trace formed within the substrate to provide a conductive thermal path from at least one of the plurality of thermal vias to the at least one of the plurality of package contacts.

11. The article of manufacture as set forth in claim 1, wherein the plurality of thermal vias are positioned along a bottom face of the die to be substantially concentrated about the thermal hotspots on the die.

12. The article of manufacture as set forth in claim 1, wherein the cross-sectional shape associated with the thermal via belonging to the plurality of thermal vias has an outer envelope formed to completely cover the thermal hotspot on the die.

13. The article of manufacture as set forth in claim 1, further comprising an integrated circuit package, wherein the substrate having the die embedded therein and the plurality of thermal vias formed therein is housed within the integrated circuit package.

14. An article of manufacture comprising:
  a package substrate comprising a core, a first substrate, a second substrate, a plurality of package contacts, and a metal layer in contact with the plurality of package contacts and the first substrate;
  a die embedded in the core of the package substrate;
  a plurality of thermal vias in the package substrate in contact with at least a portion of the metal layer, wherein the plurality of thermal vias are coupled to the die at thermal hotspots on the die and couple the thermal hotspots on the die to at least one of the plurality of package contacts, wherein a thermal via belonging to the plurality of thermal vias has a cross-sectional shape substantially similar to a union of at least two overlapping circles to substantially cover a thermal hotspot belonging to the thermal hotspots on the die; and
  copper plating in contact with the plurality of thermal vias and deposited on the die at the thermal hotspots on the die, wherein the copper plating thermally couples the thermal hotspots on the die to the plurality of thermal vias and provides an electrical connection to one or more devices on an active side of the die.

15. The article of manufacture as set forth in claim 14, wherein the metal layer includes an etching to make the electrical connection to the one or more devices on the active side of the die.

16. An apparatus, comprising:
  a substrate having an embedded die;
  means for dissipating heat from the embedded die; and
  means for thermally coupling hotspots on the embedded die to the means for dissipating the heat from the embedded die, wherein the means for thermally coupling the hotspots to the means for dissipating the heat is coupled to the embedded die at the thermal hotspots and has a cross-sectional shape substantially similar to a union of at least two overlapping circles to substantially cover the thermal hotspots on the embedded die.

17. The apparatus as set forth in claim 16, wherein the embedded die has an active side and a backside and the means for thermally coupling the hotspots to the means for dissipating the heat is coupled to the backside of the embedded die to provide a thermal path between the hotspots and the means for dissipating the heat.

18. The apparatus as set forth in claim 17, wherein the means for thermally coupling the hotspots on the embedded die to the means for dissipating the heat from the embedded die includes copper plating deposited on the backside of the embedded die.

19. The apparatus as set forth in claim 16, further comprising a flip chipped die, wherein the substrate has a first face in contact with the means for dissipating the heat from the embedded die and a second face coupled to the flip chipped die.

20. The apparatus as set forth in claim 16, wherein the substrate includes a first substrate portion, a second substrate portion, and a core, and wherein the die is embedded in the core of the substrate.

21. The apparatus as set forth in claim 20, wherein the means for thermally coupling the hotspots on the embedded die to the means for dissipating the heat from the embedded die is embedded only in the first substrate portion.

22. The apparatus as set forth in claim 20, wherein the substrate further comprises a metal layer in contact with the first substrate portion and the means for dissipating the heat from the embedded die.

23. The apparatus as set forth in claim 22, wherein the means for dissipating the heat from the embedded die is in contact with at least a portion of the metal layer.

24. The apparatus as set forth in claim 23, wherein the means for thermally coupling the hotspots on the embedded die to the means for dissipating the heat from the embedded die includes means for providing an electrical connection to one or more devices on an active side of the die, the means for providing the electrical connection deposited on the embedded die at the hotspots.

25. The apparatus as set forth in claim 16, wherein the means for thermally coupling the hotspots on the embedded die to the means for dissipating the heat from the embedded die is electrically conductive.

26. The apparatus as set forth in claim 16, further comprising means for providing a conductive thermal path between the means for dissipating the heat from the embedded die and the means for thermally coupling the hotspots on the embedded die to the means for dissipating the heat from the embedded die, the means for providing the conductive thermal path formed within the substrate.

27. The apparatus as set forth in claim 16, wherein the means for thermally coupling the hotspots on the embedded die to the means for dissipating the heat from the embedded die includes a plurality of thermal vias positioned along a bottom face of the embedded die and substantially concentrated about the thermal hotspots on the embedded die.

28. The apparatus as set forth in claim 16, wherein the cross-sectional shape associated with the means for thermally coupling the hotspots on the embedded die to the means for dissipating the heat from the embedded die has an outer envelope formed to completely cover the thermal hotspot on the embedded die.

29. The apparatus as set forth in claim 16, further comprising means for housing the substrate having the embedded die.

\* \* \* \* \*